(12) United States Patent
Fraboulet et al.

(10) Patent No.: US 7,041,539 B2
(45) Date of Patent: May 9, 2006

(54) METHOD FOR MAKING AN ISLAND OF MATERIAL CONFINED BETWEEN ELECTRODES, AND APPLICATION TO TRANSISTORS

(75) Inventors: David Fraboulet, Quaix en Chartreuse (FR); Denis Mariolle, Grenoble (FR); Yves Morand, Grenoble (FR)

(73) Assignees: Commissariat a l'Energie Atomique, Paris (FR); STMicroelectronics, Montrouge (FR)

( * ) Notice: Subject to any disclaimer, the term of this patent is extended or adjusted under 35 U.S.C. 154(b) by 0 days.

(21) Appl. No.: 10/450,966

(22) PCT Filed: Dec. 17, 2001

(86) PCT No.: PCT/FR01/04018

§ 371 (c)(1),
(2), (4) Date: Dec. 4, 2003

(87) PCT Pub. No.: WO02/50886

PCT Pub. Date: Jun. 27, 2002

(65) Prior Publication Data

US 2004/0075123 A1   Apr. 22, 2004

(30) Foreign Application Priority Data

Dec. 18, 2000 (FR) .................................. 00 16488

(51) Int. Cl.
*H01L 21/336* (2006.01)
(52) U.S. Cl. ...................... 438/158; 438/164; 438/264; 438/962; 257/E21.404
(58) Field of Classification Search ................. 438/22, 438/158, 164, 264, 265, 962; 257/29, 38, 257/39, 353, 354, E21.404, E29.322
See application file for complete search history.

(56) References Cited

U.S. PATENT DOCUMENTS

| | | | |
|---|---|---|---|
| 5,710,051 A | * | 1/1998 | Park et al. .................. 438/149 |
| 5,844,279 A | | 12/1998 | Tanamoto et al. |
| 5,972,744 A | | 10/1999 | Morimoto et al. |
| 6,042,998 A | | 3/2000 | Brueck et al. |

(Continued)

FOREIGN PATENT DOCUMENTS

| | | |
|---|---|---|
| EP | 0 844 671 A1 | 5/1998 |
| FR | 2 762 931 | 11/1998 |

OTHER PUBLICATIONS

Fujishima et al, "Proposal of a Schottky-Barrier SET Aiming at a Future Integrated Device" IEICE Transactions on Electronics, Institute of Electronics Information and Comm. Eng., Tokyo, JP vol. E80, No. 7, Jul. 7, 1997, pp 881-885.

(Continued)

*Primary Examiner*—Stephen W. Smoot
(74) *Attorney, Agent, or Firm*—Thelen Reid & Priest LLP

(57) ABSTRACT

A method produces a microstructure comprising an island of material confined between two electrodes forming barriers, the island (30) of material having lateral flanks running parallel to and lateral flanks running perpendicular to the barriers, wherein the lateral flanks of the island are defined by etching of at least one layer (16), called the template layer, and the barriers are formed by damascening. The method includes (a) a first etching of the template layer using a first etching mask having at least one filiform part, and (b) a second etching of the template layer, subsequent to the first etching, using a second etching mask also having at least one filiform part, oriented in a direction forming a non-zero angle with a direction of orientation of the filiform part of the first mask, in the vicinity of the site of formation of the island.

17 Claims, 16 Drawing Sheets

U.S. PATENT DOCUMENTS

| | | | | |
|---|---|---|---|---|
| 6,091,076 | A | 7/2000 | Deleonibus | 257/24 |
| 6,198,113 | B1* | 3/2001 | Grupp | 257/39 |
| 6,204,517 | B1* | 3/2001 | Wu | 257/51 |
| 6,414,333 | B1* | 7/2002 | Lee et al. | 257/9 |
| 6,441,392 | B1 | 8/2002 | Gautier et al. | |
| 6,472,705 | B1* | 10/2002 | Bethune et al. | 257/314 |
| 6,527,968 | B1* | 3/2003 | Wang et al. | 216/67 |

OTHER PUBLICATIONS

A. Groshev et al, "Charging Effects of a Single Quantum Level in a Box" Phys. Rev. Lett., vol 66, No. 8, pp. 1082-1085 (1991).

Futatsugi et al., "Silicon Single-Electron Memory Using Ultra-Small Floating Gate," Fujitsu Sci. Tech. J. 34, Dec. 2, 1998, pp. 142-152.

Hiramoto et al., "Quantum Energy and Charging Energy in Point Contact MOSFETs Acting as Single Electron Transistors," Superlattices and Microstructures, vol. 25, No. 1/2, 1999, pp. 263-267.

Ishikuro et al., "Fabrication of Nano-Scale Point Contact Metal-Oxide-Semiconductor Field-Effect-Transistors Using Micrometer-Scale Design Rule," Japanese Journal of Applied Physics, vol. 38, Jan. 1999, pp. 396-398.

Kim et al., "Room Temperature Single Electron Effects in Si Quantum Dot Memory with Oxide-Nitride Tunneling Dielectrics," IEEE, 1998, pp. 111-114.

Nakajima et al., "Si Single-Electron Tunneling Transistor with Nanoscale Floating Dot Stacked on a Coulomb Island y Self-Aligned Process," American Vacuum Society, Sep./Oct. 1999, pp. 2163-2171.

Park et al., Enhancement of Coulomb Blockade and Tunability by Multidot Coupling in a Silicon-on-Insulator-Based Single-Electron Transistor, American Inst. of Physics, Applied Physics Letters, vol. 75, No. 4, 1999, pp. 566-568.

Pooley et al., "Coulomb Blockade in Silicon Nano-Pillars," American Inst. of Physics, Applied Physics Letters, vol. 74, No. 15, Apr. 1999, pp. 2191-2193.

Prins et al., "Thermal Oxidation of Silicon-On-Insulator Dots," Nanotechnology 10, 1999, pp. 132-134.

Takahashi et al., "Silicon Single-Electron Devices," Int'l. Journal of Electronics, vol. 86, No. 5, 1999, pp. 605-639.

Welser et al., "Room Temperature Operation of a Quantum-Dot Flash Memory," IEEE Electron Device Letters, vol. 18, No. 6, Jun. 1997, pp. 278-280.

* cited by examiner

US 7,041,539 B2

METHOD FOR MAKING AN ISLAND OF MATERIAL CONFINED BETWEEN ELECTRODES, AND APPLICATION TO TRANSISTORS

CROSS-REFERENCE TO RELATED APPLICATION

This application claims priority based on International Patent Application No. PCT/FR01/04018, entitled "METHOD FOR MANUFACTURING AN ISLAND CONFINED BETWEEN ELECTRODES AND ITS APPLICATION IN TRANSISTORS" by David Fraboulet, Mariolle Denis and Yves Morand, which claims priority of French application no. 00/16488, filed on Dec. 18, 2000, and which was not published in English.

TECHNICAL FIELD

The present invention relates principally to a method for producing a microstructure comprising an island of material confined between two electrodes forming barriers. It also relates to the use of this method for producing highly miniaturized transistors and, in particular, for manufacturing transistors commonly known as "one" electron.

The invention has applications generally in the fields of electronics and especially in manufacturing integrated circuits, including commutation or memory transistor structures.

STATE OF THE PRIOR ART

CMOS complementary transistors (metal-oxide semiconductor transistors) are widely used for production of commutation circuits or memory circuits.

Increasing integration of circuits, accompanied by an increase in the density of components results in a reduction of component size, in particular the size of transistors. The reduction in the size of transistors introduces increasingly stringent requirements on lithographic methods used in their production and gives rise to increasing functional difficulties.

One type of transistor in particular has proved to be well adapted to the constraints of miniaturization. These are the transistors commonly known as "one" electron transistors or SET (single-electron transistor). These transistors have proved themselves also to be adapted to operation under low voltages.

In the case of these transistors, a transition from the on-state to the off-state and vice-versa is controlled by a Coulomb blockage phenomenon.

The single-electron transistors comprise generally an island of semiconductor material of manometric [sic] dimensions and connected to two electrodes by means of tunnel junctions. One such structure is described, for example, in the document (1), whose complete references are given at the end of this description. The transistors of this type can also be combined with a floating gate for controlling the charge and thus forming a memory.

An electrical capacitance existing between the island and the electrodes must be as weak as possible in order not to needlessly limit the operating frequency. In turn, the electrical capacitance between the semiconductor island and a transistor gate must be as great as possible.

Finally, for functioning of the single-electron transistors at ambient temperature, the size of their island must be minimized. The sizes of the island that are desired for function at 300 K; that is, of the order of 5 nm, are below the final limits of lithographic technologies currently used for manufacturing transistors.

The state of the prior art is further illustrated in documents (2) to (14), commented on briefly in the following and whose references are given more completely at the end of this description.

Documents (2) and (3) describe the manufacture of nano-points for storing charges and propose the utilization of stochastic layers of a material containing islands of semiconductor material.

Documents (4), (5), (6) and (7) describe other possibilities for producing the islands either by local constrictions, by depletion, using a supplemental gate or by re-oxidation using wedge effects.

Other documents relate to tunnel junctions; for example, documents (8) and (9).

Independent of the manufacture of the single-electron type transistors, a technical background relating to the lithographic methods or control of the height of small objects by chemical means is given in documents (10), (11) and (12).

Realization of elements of miniaturized transistors and especially of the miniaturized source and drain electrodes reveals not only difficulties linked to photolithographic techniques and etching but also difficulties linked to the interconnection of the miniaturized elements and their connection to other components. In fact, it is necessary to provide a connection of miniaturized elements with sufficiently wide contacts in order to assure compatibility with other elements relative to conventional microelectronics.

STATEMENT OF THE INVENTION

The object of the invention is to provide a method for producing a microstructure including an island of material confined between two electrodes which does not have the limitations of the methods described in relation to the analysis of the state of the prior art.

In particular, an object of the invention is to propose a method making it possible to obtain the smallest possible electrodes and which are separated by an island of the smallest possible width within the limits of the possibilities of resolution of photolithographic equipment.

Another object of the invention is to propose a possibility for increasing the thickness of the electrodes, whilst limiting the opposing surface between the island and the electrodes.

Yet another object of the invention is to propose a method making possible perfect alignment between the island and the electrodes, whatever the dimensions of these elements by allowing especially a reduction of the dimensions of the island within the ultimate limits of lithography.

Still another object of the invention is to propose a method for manufacturing a microstructure that is compatible, in terms of electrical or mechanical connections, with the elements or components manufactured using the techniques of conventional microelectronics; that is, using components whose dimensions are not within the limits of the resolution of lithographic tools.

An object of the invention is also to propose methods for manufacturing transistors that make use of the confined island manufacturing method. These transistors can be quite simply used as commutation transistors or can be combined with a floating gate to form memories.

To achieve these objects, the invention has the more precise object of a method for manufacturing a microstructure comprising an island of material confined between two electrodes forming barriers, the island of material having lateral flanks running parallel to and lateral flanks running perpendicular to the barriers. According to the invention, the lateral flanks of the island are defined by etching of at least one layer, commonly called the template layer, and the barriers are formed by damascening.

Damascening is defined as a technique for creating patterns in a material, generally a conductor, in which the material is deposited onto a substrate that has a negative imprint; that is, a hollowed out imprint. After deposition, the conductor material can be shaped and, in particular, can undergo planing enabling its surface projecting at the edge of the imprint to be made into the plane of the surface of the substrate. The damascening technique is a technique known per se.

The combination of the etching steps, using lithographic techniques, and the damascening step makes it possible, by virtue of the invention, to obtain microstructures having especially reduced dimensions.

The lithography step, which allows the length of the island parallel to the barriers that form the electrodes to be fixed; that is, the distance separating the opposing ends of the barriers, is independent of the steps establishing the width. It thus permits this distance to be reduced to a minimum.

According to a particular embodiment of the method of the invention, the latter can comprise a first etching of the template layer using a first etching mask having at least one filiform part and a second etching of the template layer, subsequent to the first etching, using a second etching mask also having at least one filiform part, the filiform part of the second mask being oriented in a direction forming a non-zero angle with an orientation direction of the filiform part of the first mask in the vicinity of a formation site of the island.

As indicated above, an object of the invention is to provide a method that can be used within the limits of resolution of the tools of lithography to reduce the size of the island to ultimate dimensions.

The characteristics retained here make possible utilization of the techniques of lithography under the most favorable of conditions; that is, lithography of an isolated filiform line.

Placement of the island is defined by the intersection of the trajectories of the filiform parts of the first and the second mask. It should be noted here that the first and the second masks do not physically cross inasmuch as the first mask is preferably removed before the second etching step.

The most reduced dimensions of the island are advantageously obtained when the directions of orientation of the masks are essentially perpendicular.

The template layer that can be a single layer or a stack of a plurality of sub-layers serves, as indicated above, to form the island of material. However, this template layer can also be advantageously used to simply fix the dimensions of the electrodes outside of the island formation site.

At least one part of the electrodes and in particular their proximal end, turned towards the island, is in the form of a barrier whose cross section corresponds to the width of the island. A distal end of the barriers can, in turn, be enlarged to facilitate the electrical and/or mechanical contact especially with other components, which may be less miniaturized.

The first etching of the template layer makes possible forming an impression, commonly known as the positive impression, whose form corresponds to that of the first mask. It is the part of the template layer protected by the mask.

After the first etching and before the second etching a layer, commonly called a mold, can be created around the positive impression, taking on the form of the positive impression. In this way part of the positive impression that is unprotected by the second mask is eliminated at the time of the second etching to form with the mold layer at least one negative impression corresponding to a site for at least one electrode. Then, a suitable deposit of conductor material is made in the negative impression to form said electrode.

Conductor material is defined as a material suitable for forming electrodes. It can be a conductor material in the usual sense of the term such as, for example, a metallic material or a semiconductor material. It is, for example, doped polycrystalline silicon.

In order to obtain a structure with a flat surface, favorable to the formation of other elements, the appropriate deposition of conductor material can be followed by a planishing step.

The method of the invention can be used advantageously for producing field effect transistors, Coulomb blockage transistors, memories, and, more generally, for any type of component in which the electrodes, in the form of barriers, can be comprised of source and drain electrodes.

The invention relates also to a method for manufacturing a transistor comprising the following steps:

deposition of a template layer of an electrically insulating material onto an insulating layer of a substrate;

formation of an island of material confined between a source electrode and a drain electrode, forming barriers;

formation, on top of the barriers, of a channel layer covering the island of material, the channel layer being separated from the barriers by an insulator tunnel layer, and formation of a gate, insulated from the channel layer and disposed facing the material island, in which the formation of the island of material confined between the source and drain electrodes, is in accordance with the methods described above using the template layer.

In this particular application of the invention, the channel of the transistor is produced subsequent to the formation of the electrodes. It can be formed, for example, on the flat surface obtained after planishing of the conductor material of the barriers.

According to one variant, it is also possible to form the channel even in the island in order to obtain a so-called single-electron transistor. According to this variant, the method can comprise the following steps the formation of a substrate with an embedded insulating layer supporting a stack of layers with, in the order starting from the embedded insulating layer, a semiconductor layer—the so-called channel layer—and a covering layer;

the formation of an island of material confined between a source electrode and a drain electrode forming barriers, and formation of a gate, insulated from the channel layer, and disposed facing the island of material, wherein the formation of the island of material confined between the source and drain electrodes is in accordance with the aforesaid method by using the stack of layers as the template layer.

According to this variant, the island is not a solid island but is composed of two or more sub-layers. One of the sub-layers is formed by the semiconductor layer. It is this sub-layer of the island that constitutes the channel of the transistor.

When the contact requirements risk appearing between the silicon layer and the covering layer, in virtue of the choice of materials for these layers, it is possible to provide an additional inter-layer for relaxing the constraints.

To achieve manufacture of the component, the method can be complemented by the production of a gate. The gate can be a simple gate in the case of a simple transistor or a double gate, including a floating element in the case of a memory transistor.

The step of manufacturing a gate can be either before or after production of the microstructure, including the channel, the source and the drain. In the case where the gate is a double gate, the two parts of the gate can even be formed before and after, respectively, the microstructure, including the channel.

According to a first possibility, the formation of the gate, after the formation of the island, comprises the elimination of the covering layer and the relaxation layer to form a pit above the semiconductor layer of the island and the formation, in sequence, of a gate insulator layer and a gate layer extending, in this order, into the pit to the semiconductor layer.

According to one variant, the substrate can be provided with a semiconductor layer under the embedded insulating layer and the formation of the gate, before the formation of the island, can comprise the local doping of said semiconductor layer, the doping extending into a region coinciding with a site of the island.

Other characteristics and advantages of the invention become obvious from the description that follows with reference to the figures of the appended drawings. This description is given purely for illustrative purposes and is non-limiting.

DETAILED DESCRIPTION OF THE EMBODIMENTS OF THE INVENTION

In the description that follows, the indicated parts, similar or equivalent in the various figures, are marked using the same numerical references in order to provide a more convenient relation among the figures. In addition, it should be noted that the different elements of the figures are not represented to a uniform scale for the sake of clarity.

Figure 1:
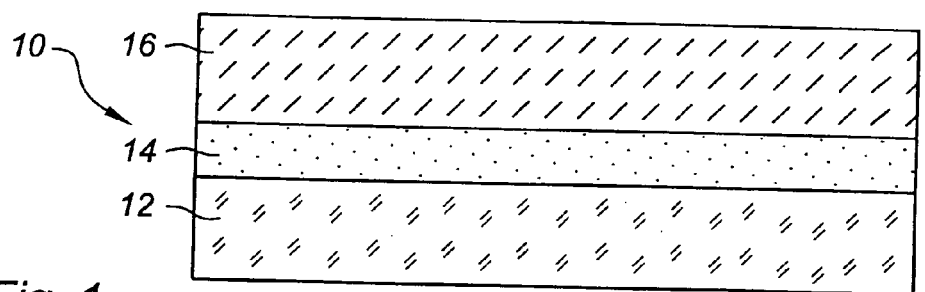
FIG. 1 is a diagrammatic section of a substrate used for manufacturing a microstructure according to a method of the invention.

FIG. 1 shows a substrate 10 used for producing a microstructure according to a method conforming to the invention. The substrate 10 comprises a thick layer 12 constituting a mechanical support. It is, for example, a solid layer of semiconductor such as silicon.

The thick layer 12 is covered with an electrically insulating layer 14. This is designated as the "embedded"

insulating layer insofar as it is covered by other layers in the course of the procedure. The embedded insulating layer is, for example, a layer of silicon oxide deposited on the thick layer and obtained by oxidation of the thick layer.

The embedded insulating layer 14 is covered by a layer 16, called the template layer. There, again, this designation is chosen for convenience and refers to an ultimate use of this layer. The criteria of choice of the materials used for the template layer will become apparent also in the continuation of the description. In the example of FIG. 1, it is a simple layer of silicon nitride whose thickness is 400 nm.

Figure 2:
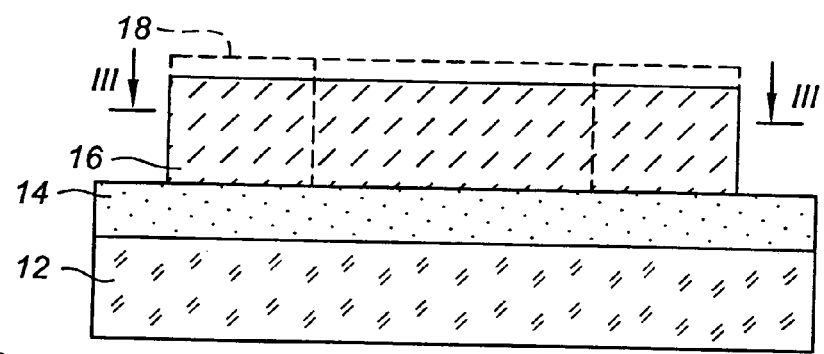
FIG. 2 represents a view in transverse section of the substrate of FIG. 1 after forming a template layer.

A first etching mask, produced using the usual techniques of lithography, is formed on the surface of the template layer and is indicated on FIG. 2 with reference 18. As will become more clearly apparent in the continuation of the description, the mask 18 makes it possible to fix the placement, the form and the dimensions of the electrodes which will be produced in the subsequent steps of the method. It also makes possible fixing the width of the island of material that will be formed in the template layer.

The mask 18 is used to preserve the part of the template layer 16 that it covers at the time of a first step of etching this layer. As shown in FIG. 2, the etching is done and stops at the embedded insulating layer 14.

Figure 3:
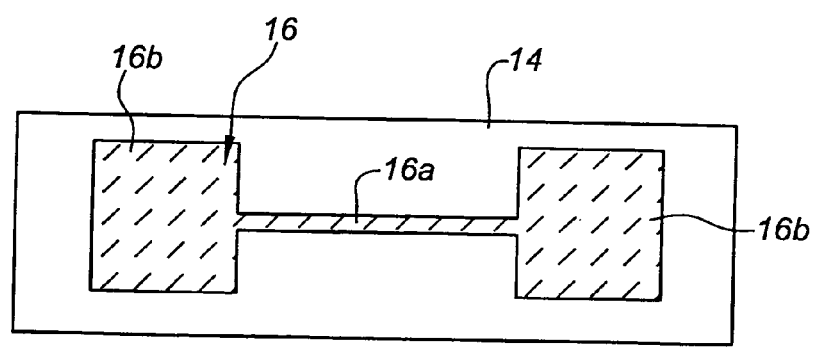
FIG. 3 represents a section along a plane III—III of the substrate of FIG. 2.

FIG. 3, which represents a cross section of FIG. 2 along the plane III—III makes it possible to better visualize the form given to the template layer 16. In FIG. 3 the etching mask 18 is removed.

The mask has a filiform strip that makes it possible to preserve a similarly filiform part 16a of the template layer 16. The filiform part connects more solid blocks 16b formed in the template layer. In the example shown, the width of the filiform part 16a of the template layer 16 is of the order of 50 nm.

Figure 4:
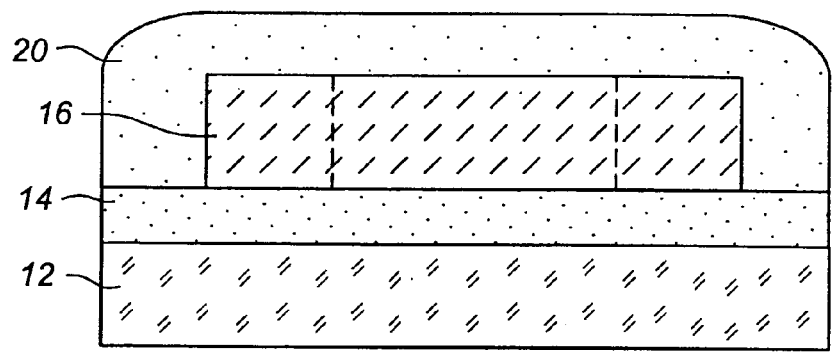
FIGS. 4 and 5 diagrammatically represent transverse sections of the substrate illustrating the formation of a mold layer encompassing the template layer.

FIG. 4 shows the deposit conforming to a layer 20, called the mold, that encompasses and covers the template layer 16 by espousing its shapes. The mold layer is, for example, a deposited layer of silicon oxide.

Figure 5:
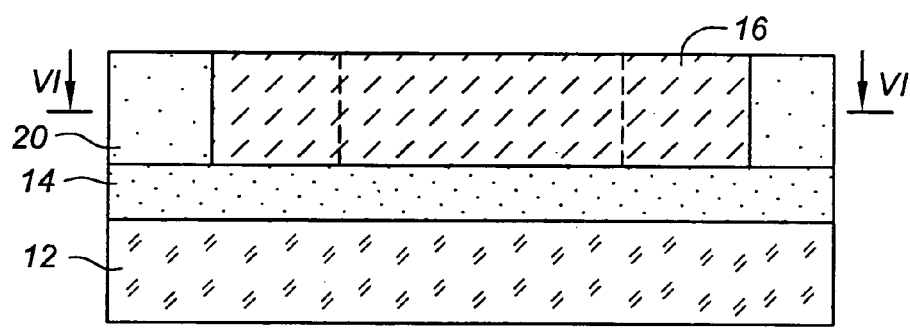

FIG. 5 represents a planishing step in which the part of the mold layer 20 that covers the template layer 16 is eliminated. Planishing is done by mechano-chemical polishing means while stopping at the template layer 16 in such a fashion that the surface of this layer and that of the mold layer are coplanar. This operation can be optimized by the appropriate choice of materials for the template layer and the mold layer. An enhanced result is obtained when the template layer has more enhanced resistance to abrasion than the mold layer so as to fulfill the role of a polishing boundary layer.

Figure 6:
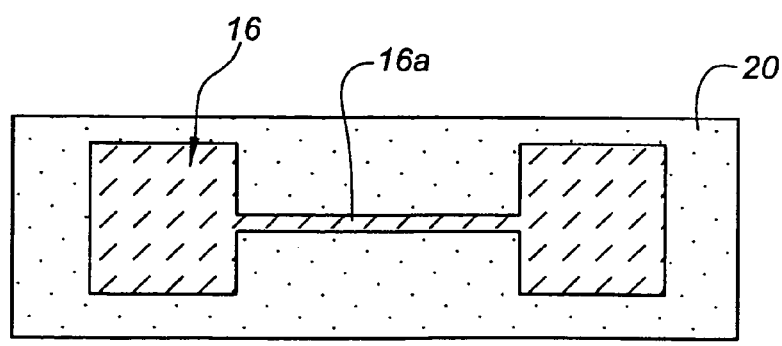
FIG. 6 represents a cross-section view along a plane VI—VI of the device of FIG. 5.

FIG. 6 represents a cross-section view along the plane VI—VI and shows that the mold layer 20 now laterally surrounds the template layer 16 while following its contours.

Figure 7:
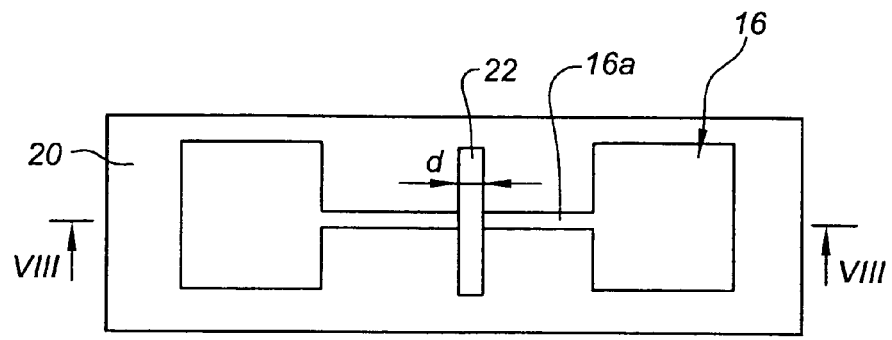
FIGS. 7, 8 and 9 are, respectively, a top view and diagrammatic transverse sections of the substrate illustrating the formation of a negative impression.

FIG. 7 represents the formation of a second etching mask 22 on the free flat surface of the template layer 16 and the mold layer 20. The mask 22 is also a filiform mask and extends in a direction essentially perpendicular to that of the first mask of FIG. 2; that is, in that of the filiform part 16a of the template layer. The placement of the second etching mask is chosen in such a way as to coincide with a section of the filiform part 16a of the template layer.

In the example described, the width d of the second mask 22 is also 50 nm.

Figure 8:
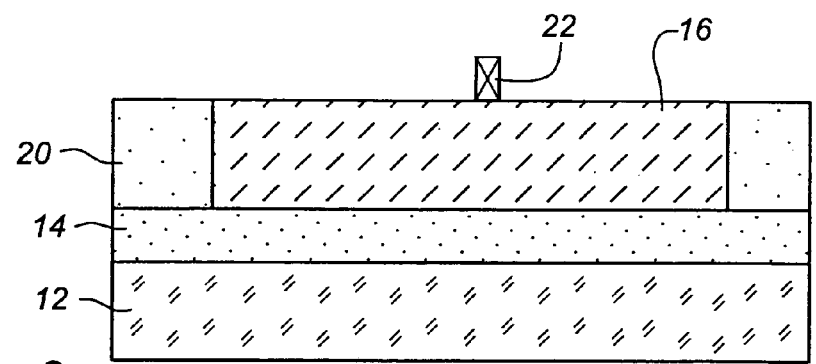

FIG. 8 represents a cross-section of the substrate and shows the placement of the second mask 22. The substrate corresponding to FIG. 8 is subjected to selective anisotropic etching. This makes it possible to selectively eliminate the material of the template layer 16 in regions where it is not protected by the mask, while preserving the mold layer.

The selective character of this etching is another element likely to be taken into account in the choice of materials for the template layer and the mold layer. The etching agent and the materials are chosen in such a fashion that etching is more rapid on the material of the template layer than on that of the mold layer.

Figure 9:
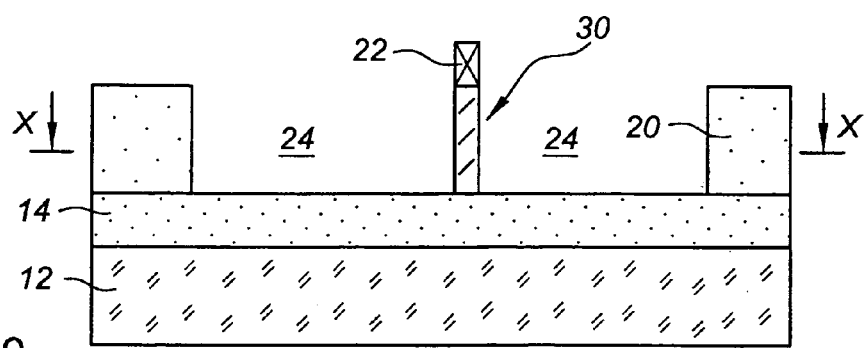

As shown in FIG. 9, etching is done by using the embedded insulating layer 14 as the etching boundary layer. For the sake of simplification, the figures do not take into account any over-etching effects due to the necessarily limited character of the selectivity of etching.

With the exception of the part of the template layer protected by the second mask, the template layer is eliminated in order to provide space for a depression 24 extending from one side to the other of a preserved part 30. The depression 24 is designated by negative impression in the continuation of the text.

Figure 10:
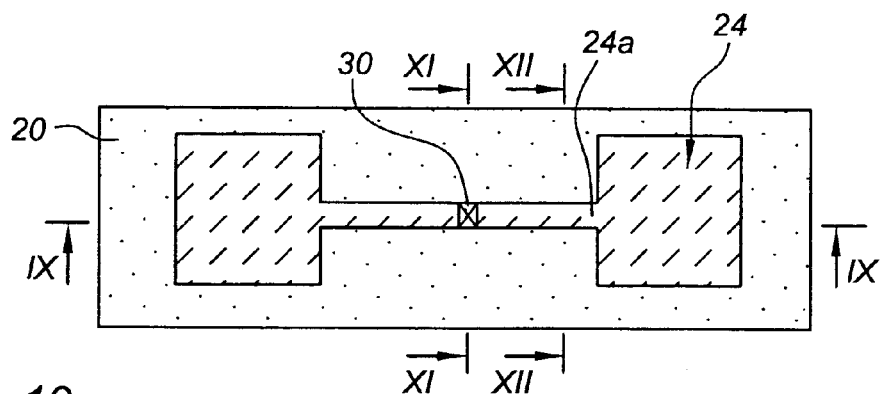
FIG. 10 represents a section along a plane X—X of the device of FIG. 9.

FIG. 10, which is a section along the plane X—X indicated in FIG. 9, makes it possible to confirm, by comparison with FIG. 3, 6 or 7, that the form of the negative impression 24 corresponds exactly to that of the template layer. It also shows that the remaining part of the template layer now forms an island. This is marked with reference 30.

Eventually, the dimensions of the island may, for example at this stage of the method, be reduced further by subjecting the material of the island to selective isotropic chemical etching.

Figure 11:
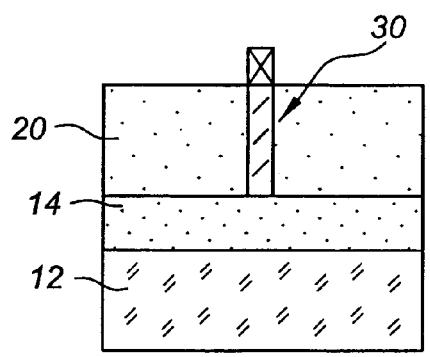
FIGS. 11 and 12 diagrammatically represent sections of the substrate of FIG. 10 along the section planes XI—XI and XII—XII.
Figure 12:
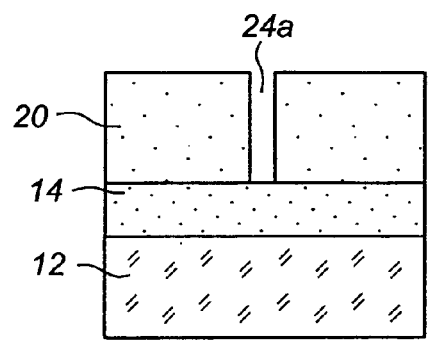

By comparing FIGS. 11 and 12, which are respectively sections XI—XI and XII—XII indicated in FIG. 10, it is confirmed that the width of the island 30 corresponds exactly to that of a groove 24a which is the negative impression corresponding to the filiform part of the template layer.

Figure 13:
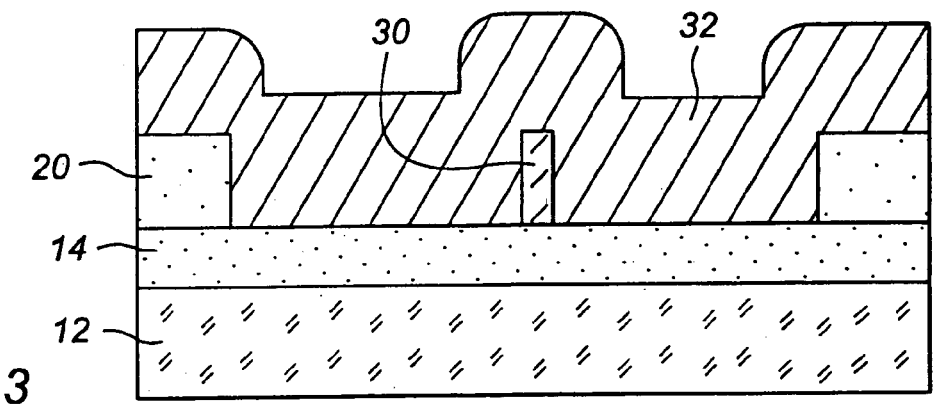
FIGS. 13 and 14 diagrammatically represent transverse sections of the substrate illustrating the formation of electrodes.

After having eliminated the second etching mask, a layer of the conductor material is deposited onto the substrate. The conductor material layer 32 is, for example, a layer of metal such as aluminum or titanium nitride. The layer of conductor material 32 has, as shown in FIG. 13, a thickness sufficient for completely filling the negative impression and for overlapping the edges of the impression formed by the mold layer 20. Deposition of the conductor material layer 32 is a uniform deposit such that this material takes on the form of the negative impression and makes contact with the flanks of the island 30 which face the groove 24a of the impression.

Figure 14:
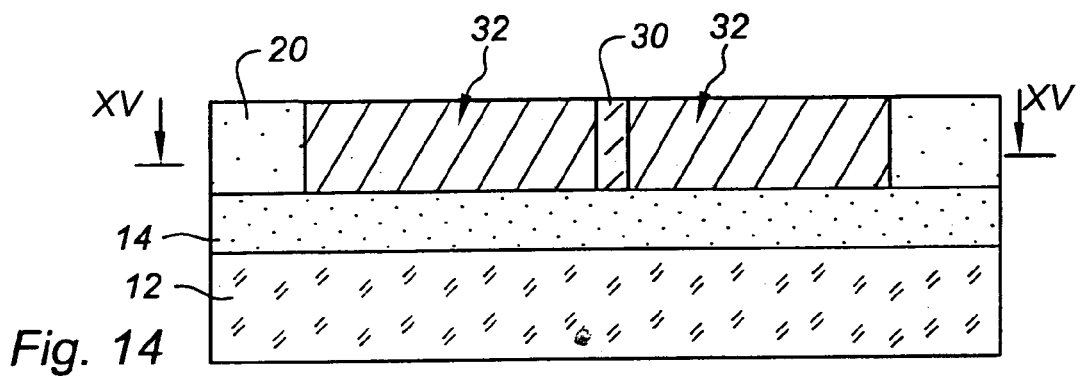

Deposition of the electrical conductor material 32 is followed by the planishing step at which the material is subjected to abrasion, stopping at the mold layer 20. At the time of the planishing step, as shown in FIG. 14, electrodes 32 and 32 are obtained disposed, respectively, on one side and the other of the island 30. The electrodes, which are not connected with each other, are separated only by the small space occupied by the island 30.

Figure 15:
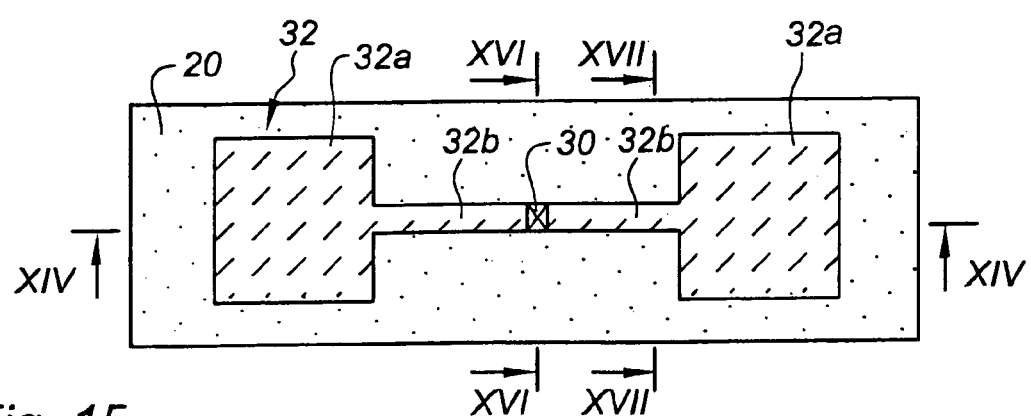
FIG. 15 is a section along a plane XV—XV of the device of FIG. 14.
Figure 16:
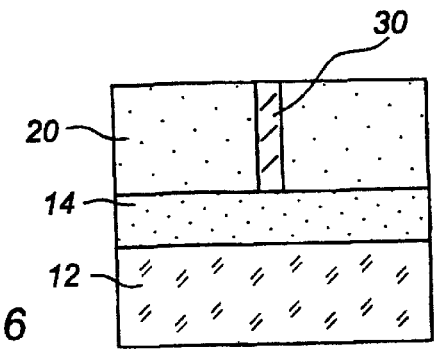
FIGS. 16 and 17 diagrammatically represent sections along the section planes XVI—XVI and XVII—XVII indicated in FIG. 15.
Figure 17:
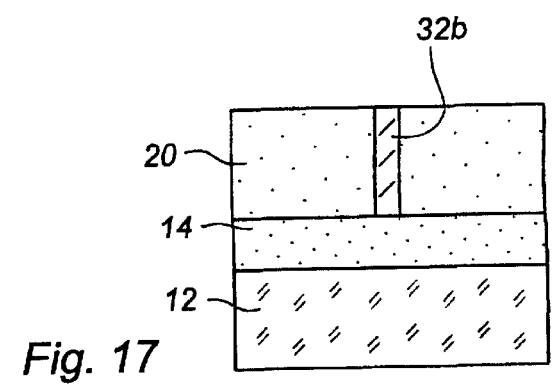

FIG. 15, which is a section of the device of FIG. 14 along the plane XV—XV, enables a better appreciation of the form of the electrodes. It is observed right away that the form of the electrodes corresponds to that of the negative impression 24 of FIG. 10 and thus to that of the template layer of FIG. 3 or 6. Each electrode has a solid part 32a and a fine barrier 32b extending from the massive part towards the island 30. The comparison of FIGS. 16 and 17 that are, respectively, sections along XVI—XVI and XVII—XVII across the device of FIG. 15, demonstrates that the barriers 32b have a width that corresponds to that of the island 30. The barriers have, in addition, flanks aligned with those of the island. In the present case, these are flanks running parallel to the direction connecting them with the solid parts of the electrodes;that is, parallel to the section plane of FIG. 14.

The devices of FIGS. 14 and 15 can be used advantageously for producing field effect components such as transistors or memories.

In the description that follows, an example of application is given which is that of manufacturing a nano-grain transistor.

Figure 18:
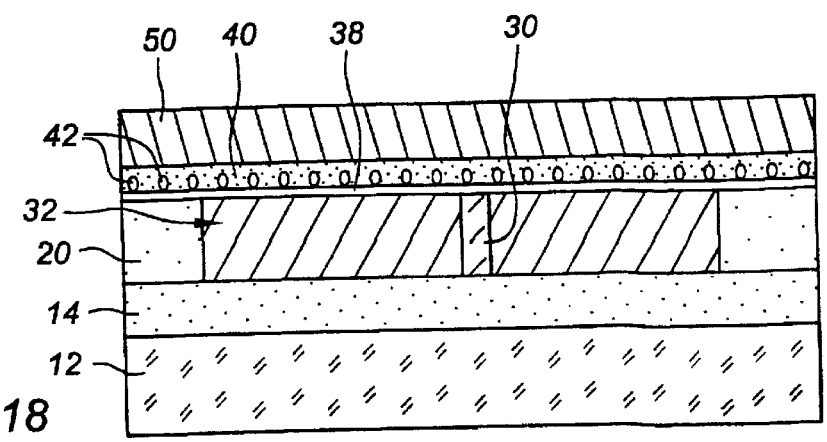
FIGS. 18 and 19 diagrammatically represent transverse sections of the substrate illustrating complementary steps for producing a transistor.

A device conforming to that of FIG. 14 is covered, as shown in FIG. 18, successively with a tunnel insulating layer 38, a nano-grain layer 40 and a gate metal layer 50. The gate metal can eventually be replaced by a non-metallic conductor material such as polycrystalline silicon. The nano-grain layer 40 comprises a plurality of grains 42 in crystalline or colloidal form embedded in an insulator material such as $SiO_2$ or SOG (spin on glass, glass). The grains 42, whose distribution is more or less regular, are grains of metal or semiconductor material.

The insulating material in which the grains are embedded can be used as a gate insulator. However, a supplementary layer of dielectric material can be provided as a gate insulator between the nano-grain layer and the gate metal.

In addition, insulator tunnel layer is defined as a layer of dielectric material such as silicon oxide or nitride whose thickness and/or dielectric constant is/are sufficiently low to permit the circulation of a channel current by tunnel effect when the transistor is in conductor operation. For materials like $SiO_2$ or $Si_3N_4$ the thickness is 1 nm, for example.

Figure 19:
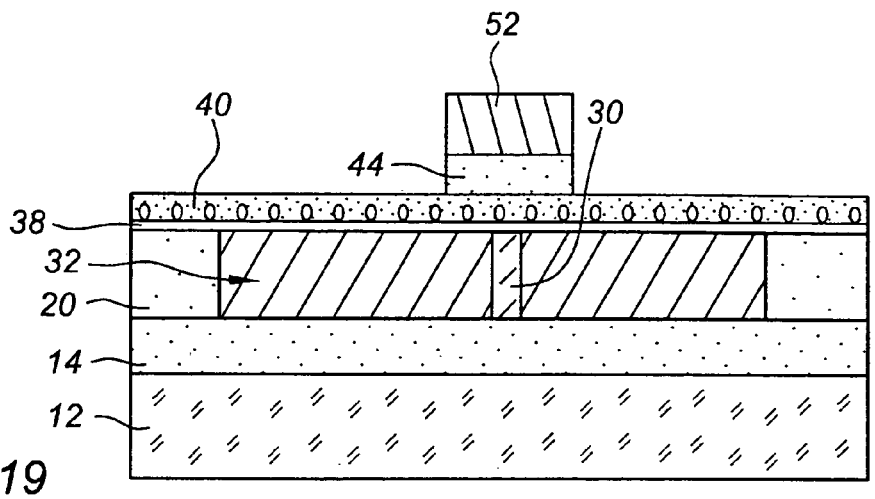

Etching of the metal layer of the gate 50 using a mask (not shown) makes it possible to shape a gate 52, as shown in FIG. 19, extending from a region situated above one of the electrodes 32 up to a region situated above the second electrode 32. The nano-grain layer 40 or at the very least the part of this layer that passes above the island comprises the transistor channel.

The electrodes 32 comprise the source and drain of the transistor.

Figure 20:
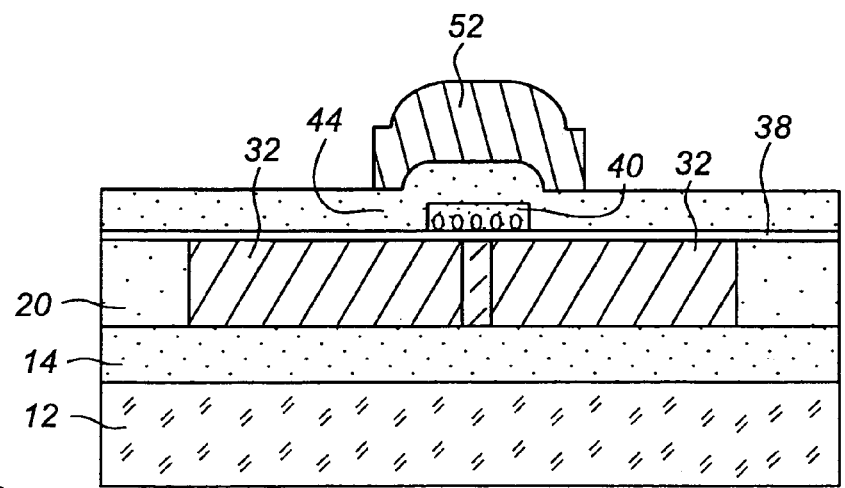
FIG. 20 represents a variant of the step corresponding to FIG. 19.

An alternative embodiment of the transistor of FIG. 19 is represented in FIG. 20. According to this alternative, the nano-grain layer 40 is formed by etching before deposition of the gate metal layer. At the time of this etching, only one portion of the nano-grain layer 40 is allowed to remain which covers the island 30 and which extends up to above the source and drain electrodes 32. This portion of the layer or at least the part that covers the island, comprises the channel of the transistor. It is designated by channel layer. It is separated from the source and the drain by the tunnel insulating layer 38.

The gate metal layer is etched using an etching mask (not shown) that is somewhat larger that that used for forming the nano-grain layer, such that the gate 52 caps the channel layer 40 portion.

It can also be noted in FIGS. 19 and 20 that a supplementary layer 44 of gate insulator separates the gate 52 from the channel layer 40. The gate insulator layer is comprised of silicon oxide, for example.

In the continuation of the description, another exemplary application of the invention is disclosed it is the manufacture of a single-electron transistor. The general principle of operation of this type of transistor will not be repeated here, because it is well-known per se and it is illustrated by the documents cited in the introductory part of the text.

Figure 21:
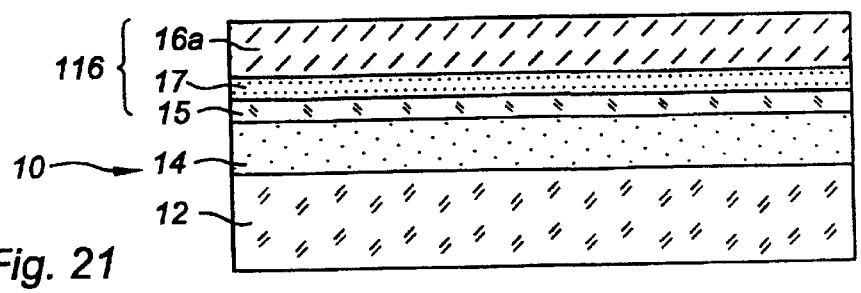
FIGS. 21 and 22 diagrammatically represent sections of a substrate, illustrating its preparation for producing a microstructure according to a variant of the method of FIGS. 1 to 20.

A first step in the method, represented in FIG. 21, is the preparation of a substrate 10. The substrate 10 of FIG. 21 comprises a thick layer 12 of silicon forming a mechanical support, an embedded electrical insulating layer 14, and a superficial thin layer 15 of semiconductor. Very advantageously, an SOI (silicon on insulator) type substrate can be used that comprises a superficial thin layer of silicon separated from a solid silicon base by an embedded layer of silicon oxide.

Preparation of the substrate is continued by the formation on the silicon layer 15 of a relaxation layer 17 and then a covering layer 16a.

The covering layer 16a has characteristics similar to those of the template layer 16 disclosed in the preceding examples. It is, however, not directly assimilable with the template layer 16 of FIG. 1. In fact, later in the method, the role of the template layer will be taken by the layer stack simultaneously comprising the semiconductor thin layer 15, the relaxation layer 17 and the covering layer 16a. This stack of layers—rather, sub-layers—comprises a new template layer referenced by 116.

It should be stated at this point that the relaxation layer 17, which is a relatively fine layer of the order of 100 nm, for example, essentially acts to prevent contact stresses between the semiconductor thin layer 15 and the covering layer 16a. Although it is not indispensable, the relaxation layer offers a greater choice of materials for the covering layer. The materials chosen for the covering layer are in fact chosen principally for their properties as a polishing boundary material and as a material enabling selective etching. These points are addressed again in the continuation of the description. Finally, it has been shown in a particular implementation of the formation of a gate, also disclosed below, that the relaxation layer 17 can also be used as an etching boundary layer.

Figure 22:
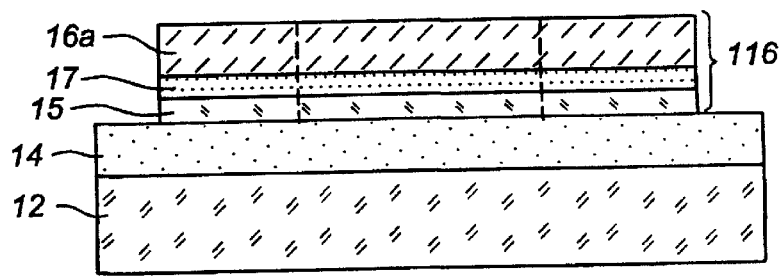
Figure 23:
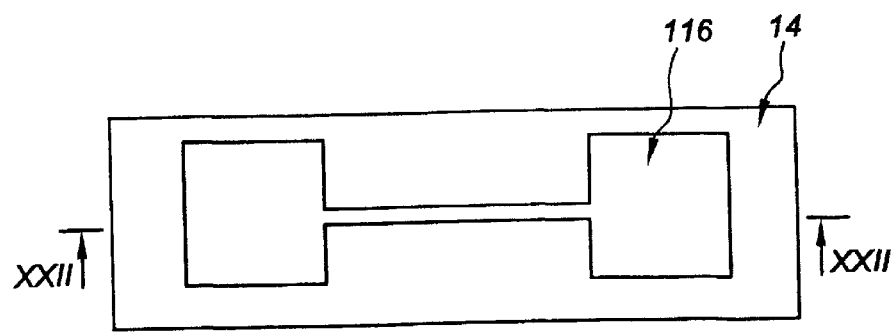
FIG. 23 represents a top view of the device of FIG. 22.

The substrate 10, prepared in this way, is subjected to etching using an etching mask (not shown) in order to provide the template layer 116 with a form corresponding to that of the future island and the future electrodes. This form can be seen in FIG. 22 and FIG. 23, which is a view from above of the device of FIG. 22. FIG. 22 shows that the etching is done with a stop at the embedded insulating layer 14 and thus that the set of sub-layers of the template layer 116 are etched using the same motif.

Figure 24:
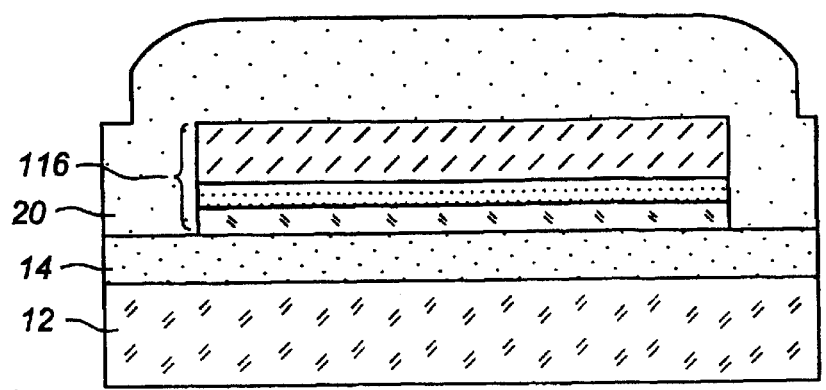
FIGS. 24 and 25 diagrammatically represent sections of the substrate illustrating coating of a stack of template layers.
Figure 25:
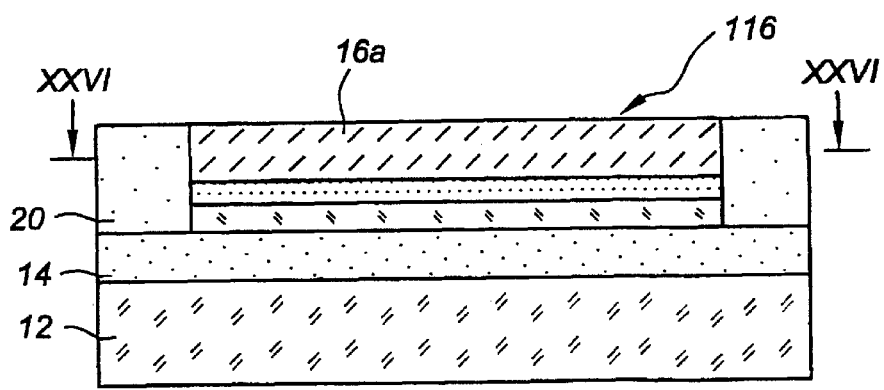
Figure 26:
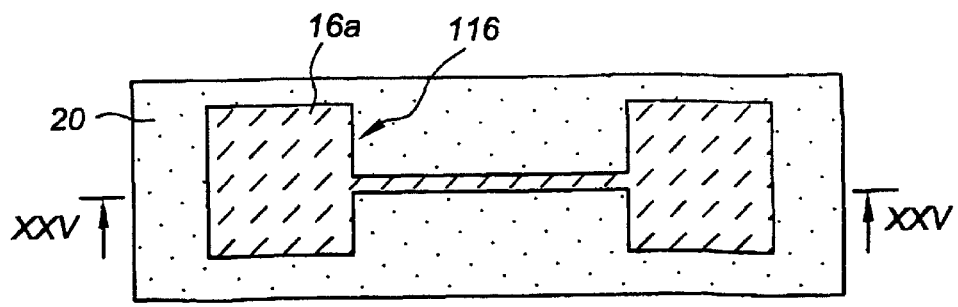
FIG. 26 represents a section along a plane XXVI—XXVI of the device of FIG. 25.

The subsequent steps are, in order, coating the template layer 116 with a mold layer 20 and planishing of the mold layer stopping at the covering layer 16a so as to expose the latter layer. These steps are represented in FIGS. 24 to 26. It serves no useful purpose at this point to proceed with a more detailed description of these figures due to the considerable similarity between these steps of the method and those already described with reference to FIGS. 4 to 6.

Figure 27:
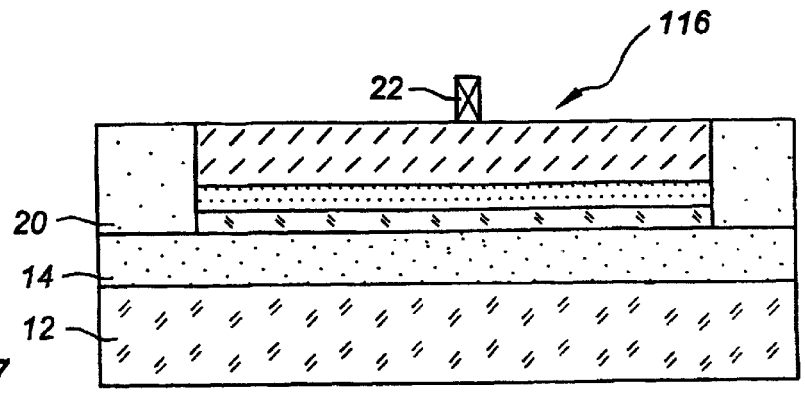
FIG. 27 diagrammatically represents a transverse section of the substrate illustrating a step for producing an island.
Figure 28:
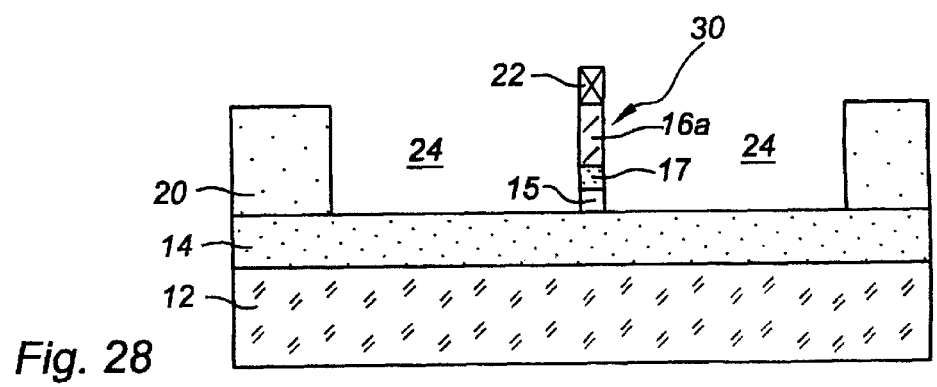
FIG. 28 diagrammatically represents a transverse section of the substrate illustrating the formation of a negative impression.

FIGS. 27 and 28 represent the second etching of the template layer intended on the one hand for establishing the longitudinal extension of the island and on the other hand for establishing the form of the negative impression 24 on either side of the island and intended for receiving the electrodes. The second etching is done by using a filiform etching mask 22 oriented perpendicular to the direction of the filiform part of the mask used for forming the template layer. It is done stopping at the embedded insulating layer 14.

FIG. 28 represents the island 30 obtained at the end of etching. The island comprises all of the stack layers forming the template layer and in particular the semiconductor layer 15. Because of the especially reduced dimensions making it possible to achieve the method of the invention, the volume of semiconductor material of the layer 15 is very low. This volume can be further reduced by reducing the height of the semiconductor thin layer. Attenuation can be done, for example, by successive oxidation and deoxidation cycles.

At this stage in the method, production of the transistor can be continued in the fashion illustrated in FIG. 13 and following, as hereinbefore described. A transistor is thus obtained, in which the channel is comprised by the small volume of the remaining semiconductor layer 15 of the island 30. Production of the gate is described later.

Figure 29:
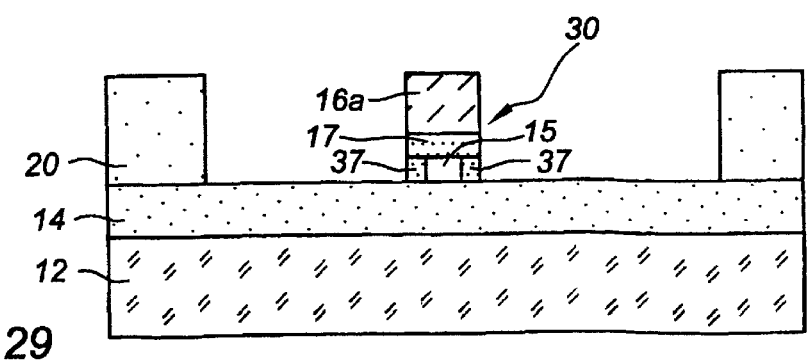
FIG. 29 diagrammatically represents a transverse section of the substrate of FIG. 28 illustrating the formation of an insulator tunnel. In this figure, the dimensions of the island have been enlarged for the sake of clarity.

According to another possibility, represented in FIG. 29, the flanks of the semiconductor layer 15 of the island 30 can even be covered with an insulator tunnel 37. It should be noted at this point that in the figure, the island 30 is not represented using the same scale as that in FIG. 29. It is considerably enlarged in order to render more visible the insulator tunnel 37. When the semi-conduction of the layer 15 is comprised of silicon, formation of the insulator tunnel 37 can come down, for example, to simple thermal oxidation of the flanks. It should be noted on this point that FIG. 29 is a section across the negative impression 24 and that only the flanks of the semiconductor layer which are exposed in the void of this impression, are provided with a tunnel insulator layer 37.

Figure 30:
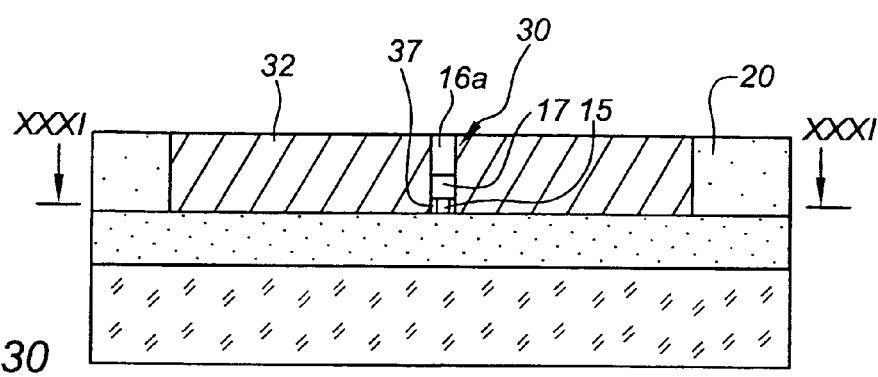
FIG. 30 diagrammatically represents a section of the substrate illustrating the formation of electrodes.

Production of the transistor is then continued by the formation of the source and drain electrodes 32 shown in FIG. 30. Formation of the source and drain electrodes can be done as hereinbefore indicated by deposition and then planishing of a layer of conductor material. In FIG. 30, the island 30 is again represented using a scale more adapted to the preceding figures.

Figure 31:
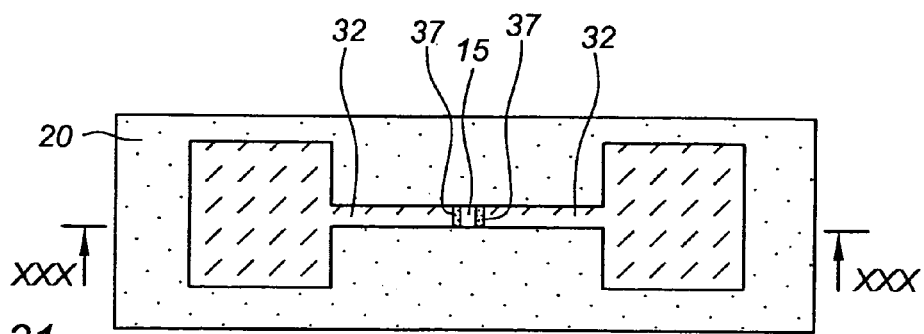
FIG. 31 represents a view from above of the device of FIG. 30 along a section plane XXXI—XXXI.

FIG. 31 is a cross-sectional view along the section plane XXXI—XXXI indicated in FIG. 30 and which passes just across the remnant of the semiconductor layer 15 of the island 30. It shows that the insulator tunnel 37, which covers the flanks of the semiconductor layer turned towards the electrodes, just separates these electrodes from the semiconductor layer of the island. The insulator 37 has essentially the same function as the insulator tunnel layer 38 of FIG. 19.

A transistor with a very low volume channel, insulated from the source and drain by an insulator tunnel enables operation of the single-electron type and makes it possible to exploit the phenomenon of Coulomb blockage.

Figure 32:
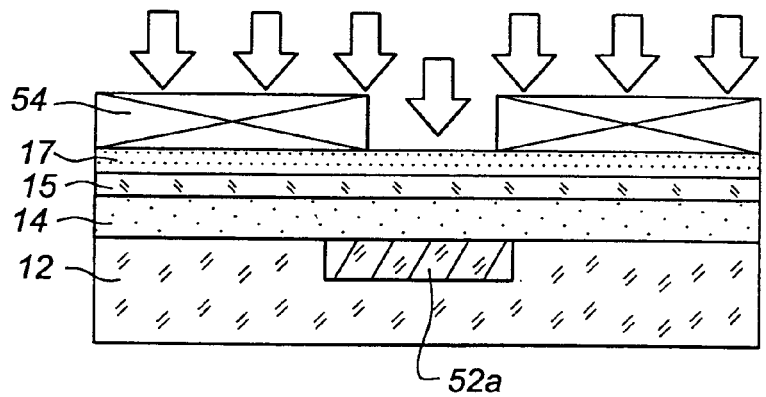
FIGS. 32, 33 and 34 diagrammatically represent sections of the substrate, illustrating the steps of the method of FIGS. 21 to 31, including the formation of an embedded gate.
Figure 33:
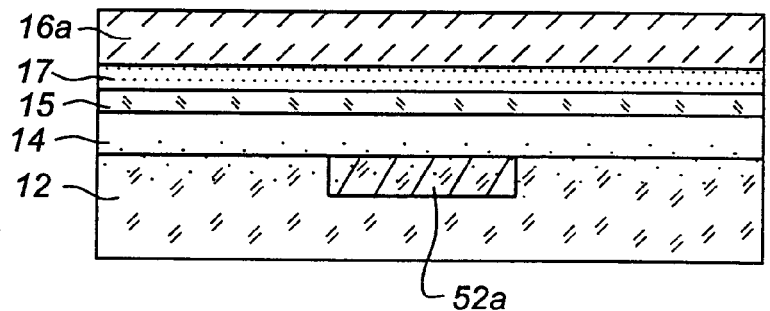
Figure 34:
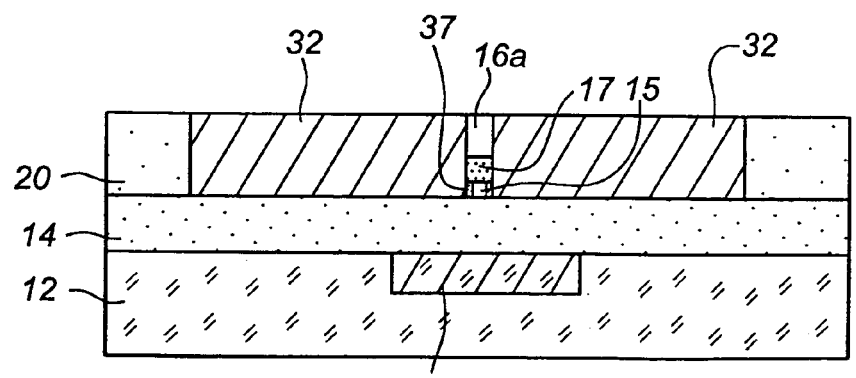

The formation of the transistor gate can be achieved in different ways. A first possibility is represented in FIGS. 32 to 34. These figures do not correspond to subsequent steps of the method but to variations of the steps hereinbefore described.

FIG. 32 represents a step that takes place just after the formation of the relaxation layer 17 and before the formation of the covering layer. It is an implantation of doping impurities intended for locally modifying the conductivity of the support layer 12.

An implantation mask 54 has for this purpose an opening coincident with a zone in which the island and thus the channel of the transistor will ultimately be realized.

Implantation of these doping impurities is done using energy sufficient for them to cross the relaxation layer 17, the semiconductor layer 15 and the embedded insulating layer 14. It enables an embedded gate 52a to be formed.

After implantation, the implantation mask is removed and the covering layer 16a is formed. These steps correspond to FIG. 31. The process of producing the transistor is then continued in the hereinbefore described fashion with reference to FIGS. 22 to 30 for obtaining the transistor of FIG. 34. It will be noted in FIG. 34 that the embedded layer 14 now serves as a gate insulator layer and separates the gate 52a from the semiconductor layer 15 of the island 30 which forms the channel. It is appropriate in this case to provide this layer with sufficient thickness that is compatible with its utilization as a gate insulator, for example a thickness of the order of 10 nm in the case of an oxide layer.

Figure 35:
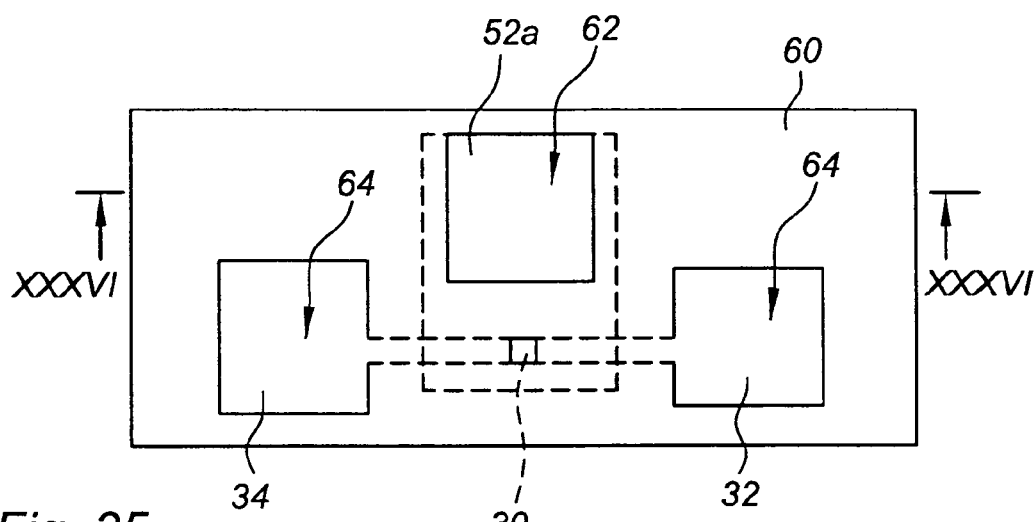
FIG. 35 represents a top view of the device of FIG. 31, on an enlarged field, illustrating the formation of a contact on the gate.
Figure 36:
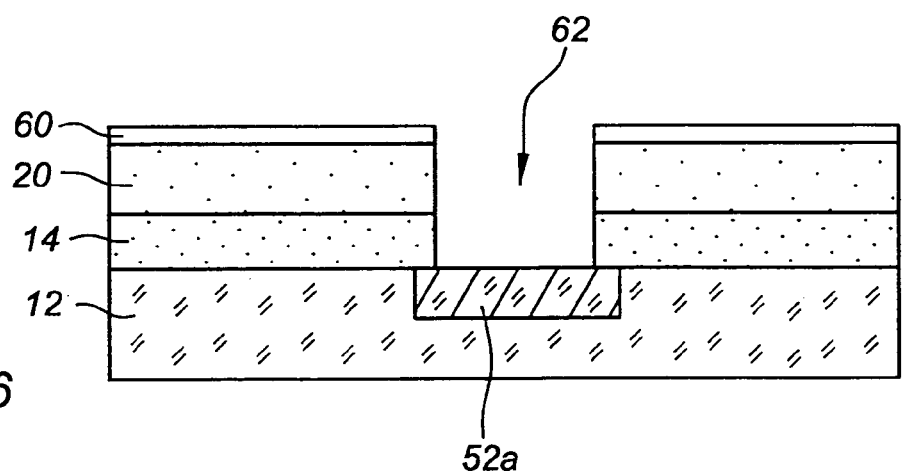
FIG. 36 represents a section XXXVI—XXXVI of the device of FIG. 35.

FIGS. 35 and 36 represent the complementary steps enabling forming an access to the embedded gate 52a. FIG. 35 is a top view of the device of FIG. 34 that has been covered with a passivation insulator 60. In this figure, the limits of the embedded gate 52a are represented by the broken lines. It should be noted that the gate extends not only under the island 30 but also outside of the zone of the island. Etching across the passivation layer of the mold layer as well as across the embedded insulating layer, also concealed, enables forming an access pit 62 and exposing the embedded gate 52a at the bottom of the pit. The pit 62 is formed outside of the zone comprising the island. Likewise, pits 64 are formed in line with source and drain electrodes 32. These are thus also exposed at the bottom of the pit. The pits 64 in line with source and drain electrodes 32 are simply etched across the passivation layer 60. These pits are then filled with a conductor material, preferably a metal (not shown) that forms access terminals to the source, to the drain and to the gate.

FIG. 36 which is a section XXXVI—XXXVI across the device of FIG. 35 shows the pits 62 above the gate 52a before placement of the metal for the access terminals.

FIGS. 37 to 41 represent another possibility for producing an insulated gate component according to the method of the invention. In this example, production of the insulated gate is also done before fabrication of the source and drain electrodes and production of the channel. Realization of the gate is done essentially at the time of preparing the substrate.

Figure 37:
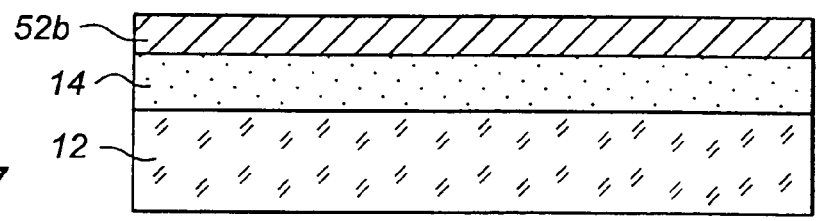
FIGS. 37, 38 and 39 represent sections of a substrate for producing a microstructure according to a process conforming to the invention, illustrating successive steps in its preparation for integrating an embedded gate therein.
Figure 38:
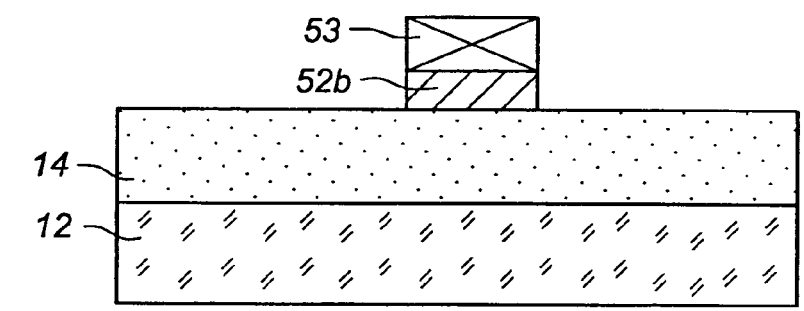
Figure 39:
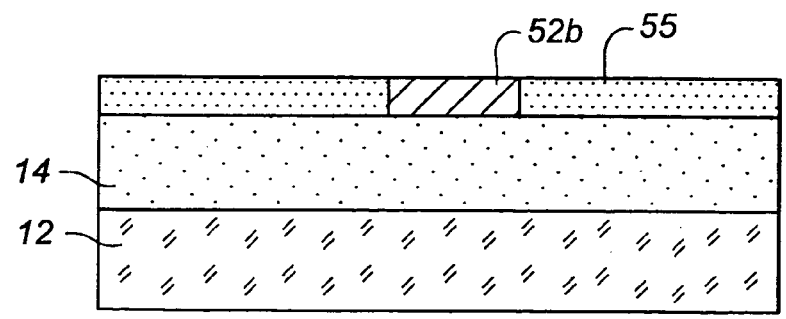

As represented in FIG. 37, preparation of the substrate comprises the formation on a support layer 12 of an embedded insulating layer 14 covered with an electrical conductor material layer 52b. The conductor layer is, for example, a metallic layer such as TiN, Al or poly-Si doped in situ or a layer of semiconductor doped in such a way as to increase its conductivity. It is subjected to etching using an etching mask 53 shown in FIG. 38. The etching mask 53 enables preserving at the time of etching a part of the conductor layer 52b. This part comprises the gate. Formation of the gate 52b is followed by deposition of a layer of electrically insulating material 55, for example an oxide of silicon, then by planishing this layer stopping at the gate 52b. Planishing makes it possible to obtain, as represented in FIG. 39, an insulating layer 55 with a flat surface with which the gate 52b is flush.

Figure 40:
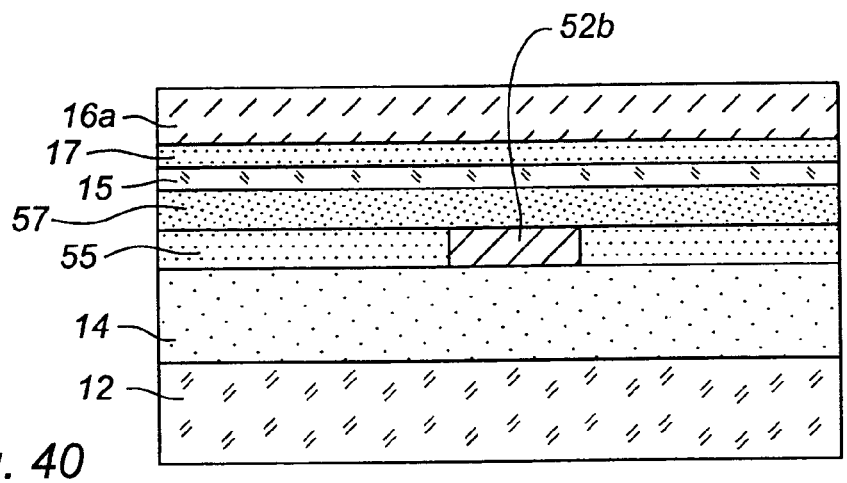
FIGS. 40 and 41 diagrammatically represent sections of the substrate of FIG. 39 illustrating its use in a method for producing a microstructure in accordance with the invention.
Figure 41:
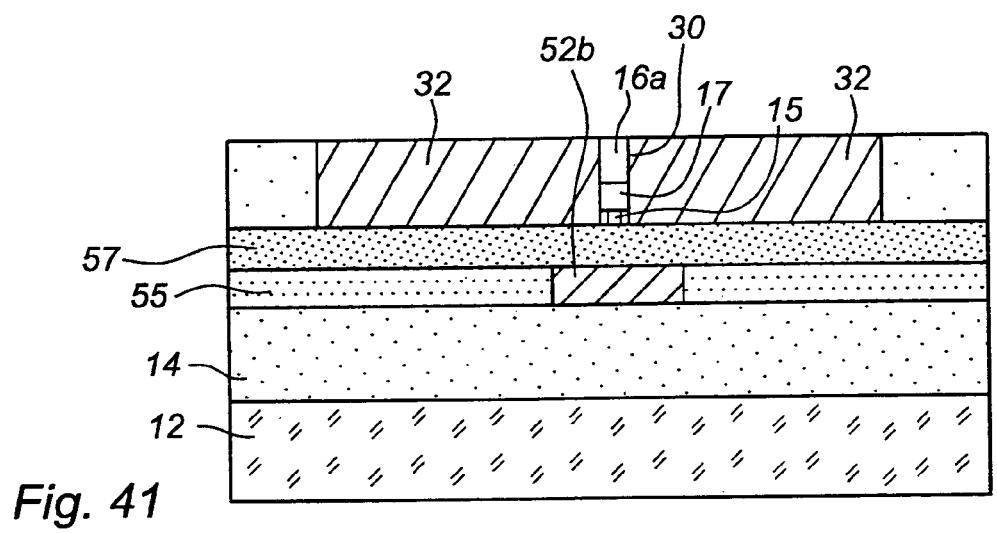

A gate insulator layer 57, a semiconductor thin layer 15, possibly a relaxation layer 17, and a covering layer 16a are then formed, in that order, on this flat surface. These layers, which are represented in FIG. 40, are the same as those already described with reference to FIG. 21, to which reference may be made.

The operations that follow relate to definition of the island and the formation of the source and drain electrodes. These operations correspond essentially to those disclosed with reference to FIGS. 21 to 30 and their detailed description is not repeated at this point. At the end of these operations a device is obtained that conforms to FIG. 41. It can be noted that the placement of the island 30, determined essentially by that of the successive etching masks (not shown here), coincides essentially with the middle part of the gate 52b, considered in the direction linking the source and the drain. The gate 52b thus separated from the channel 15 by the gate insulator layer 57 thus opposes said channel as well as a part of the source and drain electrodes 32.

Figure 42:
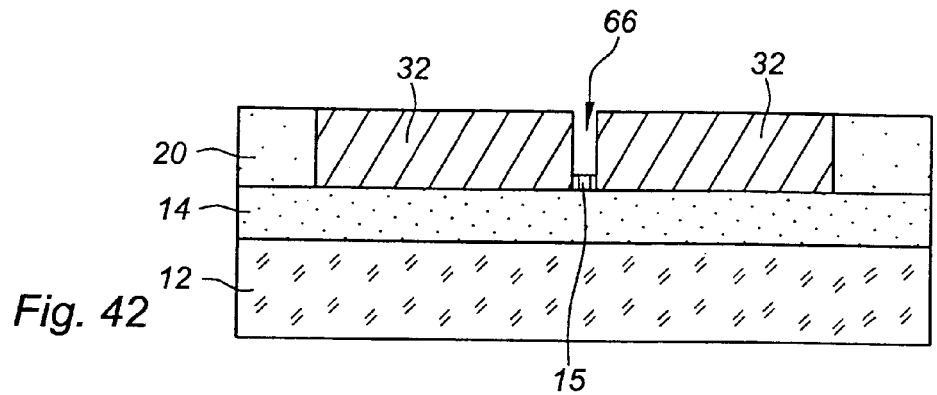
FIGS. 42 and 43 diagrammatically represent sections of a device according to FIG. 30 and illustrating its use for producing a transistor.
Figure 43:
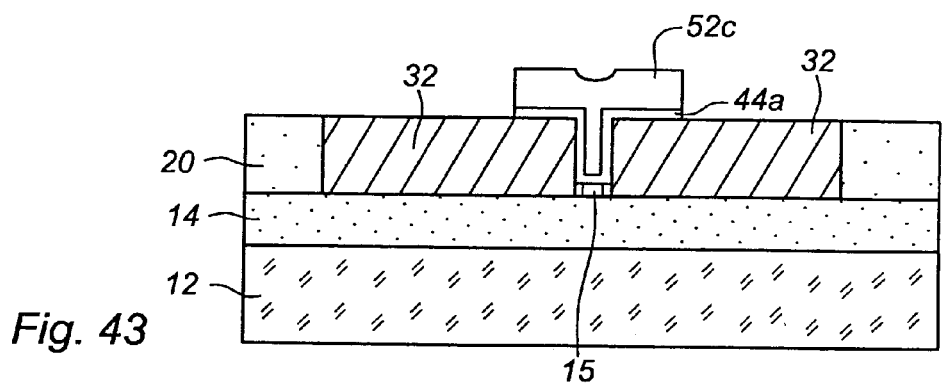
Figure 44:
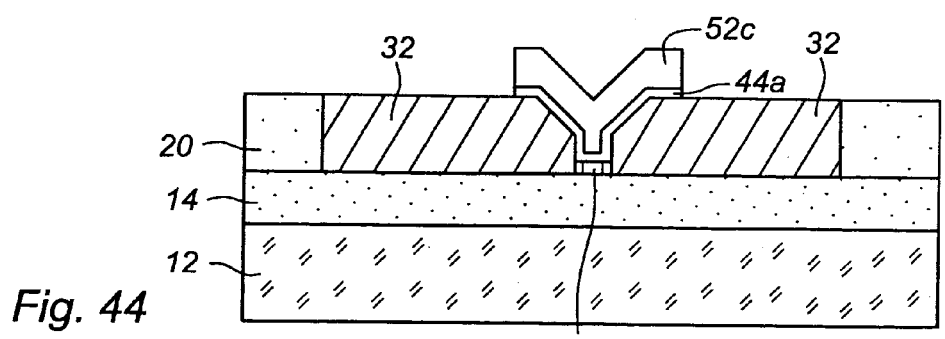
FIG. 44 diagrammatically represents a transistor produced according to a method in accordance with the invention and constituting a variant of that represented in FIG. 43.

FIGS. 42 to 44 represent a last example for producing the gate. FIG. 42 shows a device identical to that of FIG. 30 from which the covering layer and the relaxation layer have been removed by selective etching. Removal of these layers results in exposure of the portion of the semiconductor layer 15 forming the channel. This portion is found at the bottom of a pit referenced with 66.

Formation of the gate is continued by deposition of a gate insulator layer and then by deposition of a conductor material layer. These layers, represented in FIG. 43, are initially deposited so as to cover the exposed surface of the device onto which the pit 66 opens as well as to fill the pit 66. In other words, the conductor material layer in which the gate is formed, extends up to the channel 15 at the base of the pit, from which it is separated and insulated only by the gate insulator layer. Etching using a mask (not shown) then enables forming the gate 52c represented in FIG. 43. The gate insulator layer 44a is also represented therein.

FIG. 44 represents a variant of this method in which a super-etching has been done at the time of forming the pit 66. The super-etching, also selective, makes possible cutting into the electrode material so as to cause the formation of facets at the edge of the pit.

The facets enable, as shown in the figure, better access from the gate 52c to the region of the channel 15.

Relevant Documents
(1) FR-A-2 749 977
(2) W. Chen, H. Ahmed, K. Nakazato, Appl. Phys. Letts 66, 3383 (1995).
(3) I. Kim et al IEDM 1998, 5.2.1.
(4) J. W. Park, Appl. Phys; Letts, Vol. 75, N° 5, p. 566, 1999.
(5) D. Kern, Microelect. Eng. 46 (1999) 141–144.
(6) Y. Takahashi et al., Int. J. Electronics, Vol. 86, N° 5, p. 605, 1999.
(7) T. Hiramoto, Superlattices and Microstructures, Vol. 25, N° 1/2, p. 263, 1999.
(8) Coulomb Blocade in Silicon Nano-pillars, D. M. Pooley and H. Ahmad, Applied Physics Letters, Vol. 74, N° 15, p. 2191.
(9) L. Palun, MNE 1999, Thesis 2000.
(10) T. Futatsugi et al., Fujitsu Sci. Tech. J. 34, 2, pp. 142–152.
(11) Nakajima et al. J Vac Sci Technol 817/5 September/October 1999, 2163.
(12) F. E. Prins et al., Nanotechnology 10 (1999) 132–134.
(13) IEEE ELECTRON DEVICE LETTERS, Vol 18, N° 6? JUNE 1997, pp. 278–280, "Room temperature operation of a quantum-dot flash memory", J. J. Welser, Sandip Tiwari, R. Rishton, K. Y. Lee and Y. Lee.
(14) Jpn. J. Appl. Phys., Vol. 38 (1999), pp. 396–398, Part I, N° 1B, January 1999, ©1999 Publication Board, Japanese Journal of Applied Physics, "Fabrication of Nanoscale contact metal-oxide semiconductor field-effect transistors using micrometer scale design rule." Institute of Industrial Science, University of Tokyo, 7–22 Roppongi, Minato-ku, Tokyo 106–8558 Japn.

The invention claimed is:

1. A method for producing a microstructure comprising an island of material confined between two electrodes forming barriers, the island of material having lateral flanks running parallel to and lateral flanks running perpendicular to the barriers, wherein the lateral flanks of the island are defined by etching of at least one layer, called the template layer, and the barriers are formed by damascening, wherein said method comprising:

first etching of the template layer using a first etching mask having at least one filiform part; and a second etching of the template layer, subsequent to the first etching, using a second etching mask also having at least one filiform part, oriented in a direction forming a non-zero angle with a direction of orientation of the filiform part of the first mask, in the vicinity of the site of formation of the island.

2. The method according to claim 1, wherein the angle formed between the directions of orientation of the first and the second masks is essentially a right angle.

3. The method according to claim 1, wherein after the first etching, at the time of which a positive impression is formed in the template layer corresponding to the first mask and, before the second etching, a layer called the mold layer is formed around said positive impression, said layer taking on the form of the positive impression, in which a part of the unprotected positive impression is removed by a second mask at the time of the second etching, in order to form with the mold layer at least one negative impression corresponding to a site for at least one electrode and into which a conductor material is uniformly deposited into the negative impression for forming said electrode.

4. The method according to claim 3, comprising in addition planishing of the conductor material.

5. The method according to claim 3, comprising in addition planishing of the mold layer, when the latter covers the positive impression, in order to expose one etching face of the positive impression.

6. A method for producing a transistor comprising the following steps:

deposition of a template layer of an electrically insulating material onto an insulating layer of a substrate;

formation of an island of material confined between a source electrode and a drain electrode, forming barriers;

formation over the barriers of a channel layer covering the island of material, and formation of an insulated gate deposited facing the island of material, wherein the formation of the island of material confined between the source and the drain electrodes utilizes the template layer, the island of material having lateral flanks running parrallel to and lateral flanks running perpendicular to the barriers, wherein the lateral flanks of the island are defined by etching of at least one layer, called the template layer, and the barriers are formed by damascening.

7. The method according to claim 6, wherein the channel layer is separated from the electrodes by an insulator tunnel layer.

8. A method for producing a transistor comprising the following steps:

formation of a substrate with an embedded insulating layer supporting a stack of layers comprising in order, starting from the embedded insulating layer, a semiconductor layer and a covering layer;

formation of an island of material confined between a source electrode and a drain electrode, forming barriers, and formation of a gate, insulated from the semiconductor layer and arranged facing the island of material, wherein the formation of the island of material confined between the source and the drain electrodes utilizes the stack of layers as the template layer, the island of material having lateral flanks running parallel to and lateral flanks running perpendicular to the barrier, wherein the lateral flanks of the island are defined by etching of the stack of layers, and the barriers are formed by damascening.

9. The method according to claim 8, wherein the stack of layers comprises in addition a relaxation layer arranged between the semiconductor layer and the covering layer.

10. The method according to claim 8, comprising in addition a step of thermal oxidation of flanks of the semiconductor layer subsequent to the formation of the island and prior to the formation of the source and of the drain electrodes to form insulator tunnel layers.

11. The method according to claim 8, wherein the formation of the substrate comprises a step of thinning the semiconductor layer, preceding the formation of a relaxation layer.

12. The method according to claim 8, wherein the formation of the gate, subsequent to the formation of the island, comprises the elimination of the covering layer to form a pit above the semiconductor layer of the island and the formation, in order, of a gate insulator layer and a gate layer extending into the pit up to the semiconductor layer.

13. The method according to claim 8, wherein the substrate comprises a semiconductor layer under the embedded insulating layer and wherein the formation of the gate, prior to the formation of the island, comprises local doping of said semiconductor layer, said doping extending into a region coinciding with a site of the island.

14. The method according to claim 13, wherein doping is done by implantation across the embedded insulating layer and across the stack of layers.

15. The method according to claim 13, wherein doping is done extending also into a zone situated outside of the region coinciding with the site of the island and in which an access pit is formed at said doped zone of the semiconductor layer under the embedded insulating layer, also outside of the site of the island.

16. The method according to claim 13, wherein the doping is done across the semiconductor layer of the stack and across the embedded insulating layer.

17. The method according to claim 8, comprising, prior to the formation of the stack, deposition onto the substrate of a layer of conductor material, etching of said layer for defining a gate, deposition of an electrical insulator material, planishing of this layer until reaching the gate, and the formation of a gate insulator layer covering the gate, the stack being formed on the gate insulator layer.

* * * * *